United States Patent
Hishiya et al.

(10) Patent No.: US 12,018,366 B2
(45) Date of Patent: Jun. 25, 2024

(54) SUBSTRATE PROCESSING APPARATUS AND CLEANING METHOD

(71) Applicant: Tokyo Electron Limited, Tokyo (JP)

(72) Inventors: Shingo Hishiya, Yamanashi (JP); Sung Duk Son, Gyeonggi-do (KR)

(73) Assignee: Tokyo Electron Limited, Tokyo (JP)

( * ) Notice: Subject to any disclaimer, the term of this patent is extended or adjusted under 35 U.S.C. 154(b) by 390 days.

(21) Appl. No.: 17/186,149

(22) Filed: Feb. 26, 2021

(65) Prior Publication Data

US 2021/0292905 A1    Sep. 23, 2021

(30) Foreign Application Priority Data

Mar. 18, 2020 (JP) .................. 2020-047624

(51) Int. Cl.
*C23C 16/44* (2006.01)
*C23C 16/455* (2006.01)
*C23C 16/458* (2006.01)

(52) U.S. Cl.
CPC ...... *C23C 16/4412* (2013.01); *C23C 16/4405* (2013.01); *C23C 16/4408* (2013.01); *C23C 16/45534* (2013.01); *C23C 16/45544* (2013.01); *C23C 16/45578* (2013.01); *C23C 16/4583* (2013.01)

(58) Field of Classification Search
CPC ............ C23C 16/4412; C23C 16/4405; C23C 16/4408; C23C 16/45534; C23C 16/45544; C23C 16/45578; C23C 16/4583; C23C 16/54; C23C 16/45546; H01L 21/67017; H01L 21/67028
See application file for complete search history.

(56) References Cited

U.S. PATENT DOCUMENTS

| | | | | |
|---|---|---|---|---|
| 4,699,805 A | * | 10/1987 | Seelbach | C23C 16/455 333/260 |
| 6,383,300 B1 | * | 5/2002 | Saito | C23C 16/4405 118/724 |
| 8,808,455 B2 | * | 8/2014 | Saito | C23C 16/45527 118/724 |
| 10,081,868 B2 | * | 9/2018 | Takagi | C23C 16/45578 |
| 10,655,218 B2 | * | 5/2020 | Kamakura | H01L 21/02164 |

(Continued)

FOREIGN PATENT DOCUMENTS

| | | | |
|---|---|---|---|
| JP | 2009295729 A | * | 12/2009 |
| JP | 2018-085393 | | 5/2018 |
| JP | 2021150440 A | * | 9/2021 |

*Primary Examiner* — Jeffrie R Lund
(74) *Attorney, Agent, or Firm* — IPUSA, PLLC

(57) ABSTRACT

A substrate processing apparatus includes a processing chamber configured to accommodate a substrate, an injector, including a first connection port and a second connection port, wherein an inside of the injector communicates with an inside of the processing chamber, an exhaust pipe configured to exhaust the inside of the processing chamber, a source gas introducing pipe, connected to the first connection port, and configured to introduce a source gas into the injector, a cleaning gas introducing pipe configured to introduce a cleaning gas into the injector through one of the first connection port and the second connection port, and a vent pipe, connecting the exhaust pipe and the other of the first connection port and the second connection port, and configured to exhaust the inside of the injector.

6 Claims, 5 Drawing Sheets

(56) References Cited

U.S. PATENT DOCUMENTS

| | | | | |
|---|---|---|---|---|
| 11,261,528 B2* | 3/2022 | Hiramatsu | ........ | C23C 16/45578 |
| 2002/0014205 A1* | 2/2002 | Shin | .................... | C23C 16/4412 |
| | | | | 118/715 |
| 2002/0124800 A1* | 9/2002 | Moriyama | ........ | H01L 21/67109 |
| | | | | 118/715 |
| 2002/0192369 A1* | 12/2002 | Morimoto | ......... | C23C 16/45561 |
| | | | | 118/712 |
| 2008/0075838 A1* | 3/2008 | Inoue | ................ | H01L 21/31662 |
| | | | | 118/715 |
| 2008/0264337 A1* | 10/2008 | Sano | .................... | C23C 16/4408 |
| | | | | 204/192.12 |
| 2012/0100722 A1* | 4/2012 | Asai | .................... | H01L 21/0217 |
| | | | | 438/758 |
| 2012/0160172 A1* | 6/2012 | Wamura | .................... | B08B 9/02 |
| | | | | 118/726 |
| 2017/0029945 A1* | 2/2017 | Kamakura | ............ | C23C 16/402 |
| 2018/0142357 A1* | 5/2018 | Furusawa | ............ | C23C 16/4412 |
| 2018/0312967 A1* | 11/2018 | Ishii | .................. | C23C 16/45578 |
| 2019/0161853 A1* | 5/2019 | Aoyama | ............. | C23C 16/0209 |
| 2019/0169742 A1* | 6/2019 | Ishibashi | .............. | C23C 16/4412 |
| 2020/0098555 A1* | 3/2020 | Ebata | ................ | C23C 16/45546 |
| 2021/0292905 A1* | 9/2021 | Hishiya | ............... | C23C 16/4408 |

* cited by examiner

SUBSTRATE PROCESSING APPARATUS AND CLEANING METHOD

CROSS-REFERENCE TO RELATED APPLICATIONS

This application is based upon and claims priority to Japanese Patent Application No. 2020-047624, filed on Mar. 18, 2020, the entire contents of which are incorporated herein by reference.

BACKGROUND

1. Field of the Invention

The present disclosure relates to substrate processing apparatuses and cleaning methods.

2. Description of the Related Art

A substrate processing apparatus is used for a semiconductor manufacturing process. The substrate processing apparatus includes a processing chamber configured to accommodate a plurality of substrates, an injector configured to supply a gas into the processing chamber, and a flow rate controller configured to control a flow rate of the gas, for example. The substrate processing apparatus may perform a deposition process to simultaneously form a film on a plurality of substrates by an Atomic Layer Deposition (ALD), for example. In such a substrate processing apparatus, there is a known method of providing a scavenging line for scavenging the inside of the injector, in order to prevent particles generated by by-products or the like adhered inside the injector from entering the processing chamber (refer to Japanese Laid-Open Patent Publication No. 2018-085393, for example).

SUMMARY

According to one aspect of the embodiments, a substrate processing apparatus includes a processing chamber configured to accommodate a substrate; an injector, including a first connection port and a second connection port, wherein an inside of the injector communicates with an inside of the processing chamber; an exhaust pipe configured to exhaust the inside of the processing chamber; a source gas introducing pipe, connected to the first connection port, and configured to introduce a source gas into the injector; a cleaning gas introducing pipe configured to introduce a cleaning gas into the injector through one of the first connection port and the second connection port; and a vent pipe, connecting the exhaust pipe and the other of the first connection port and the second connection port, and configured to exhaust the inside of the injector.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DETAILED DESCRIPTION

Figure 1:
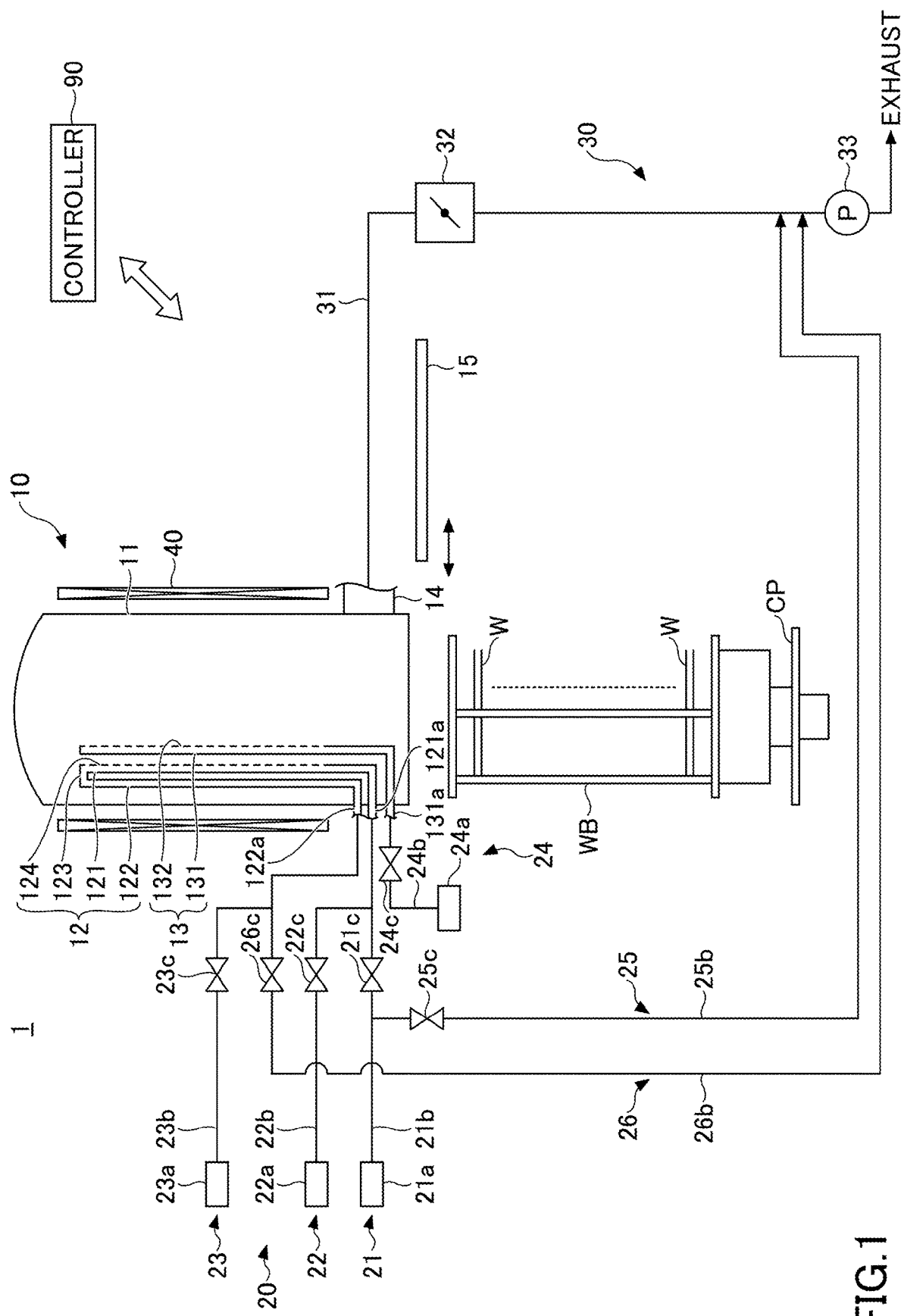
FIG. 1 is a diagram illustrating an example of a configuration of a substrate processing apparatus according to a first embodiment.

A description will hereinafter be given of embodiments of the present invention, which are non-limiting examples of the present disclosure, by referring to the accompanying drawings. In the drawings, the same or corresponding constituent elements (that is, components, parts, members, or the like) are designated by the same or corresponding reference numerals, and a repeated description of the same or corresponding constituent elements will be omitted.

The present disclosure provides a technique for selectively cleaning the inside of an injector.

First Embodiment

<Substrate Processing Apparatus>

Figure 2:
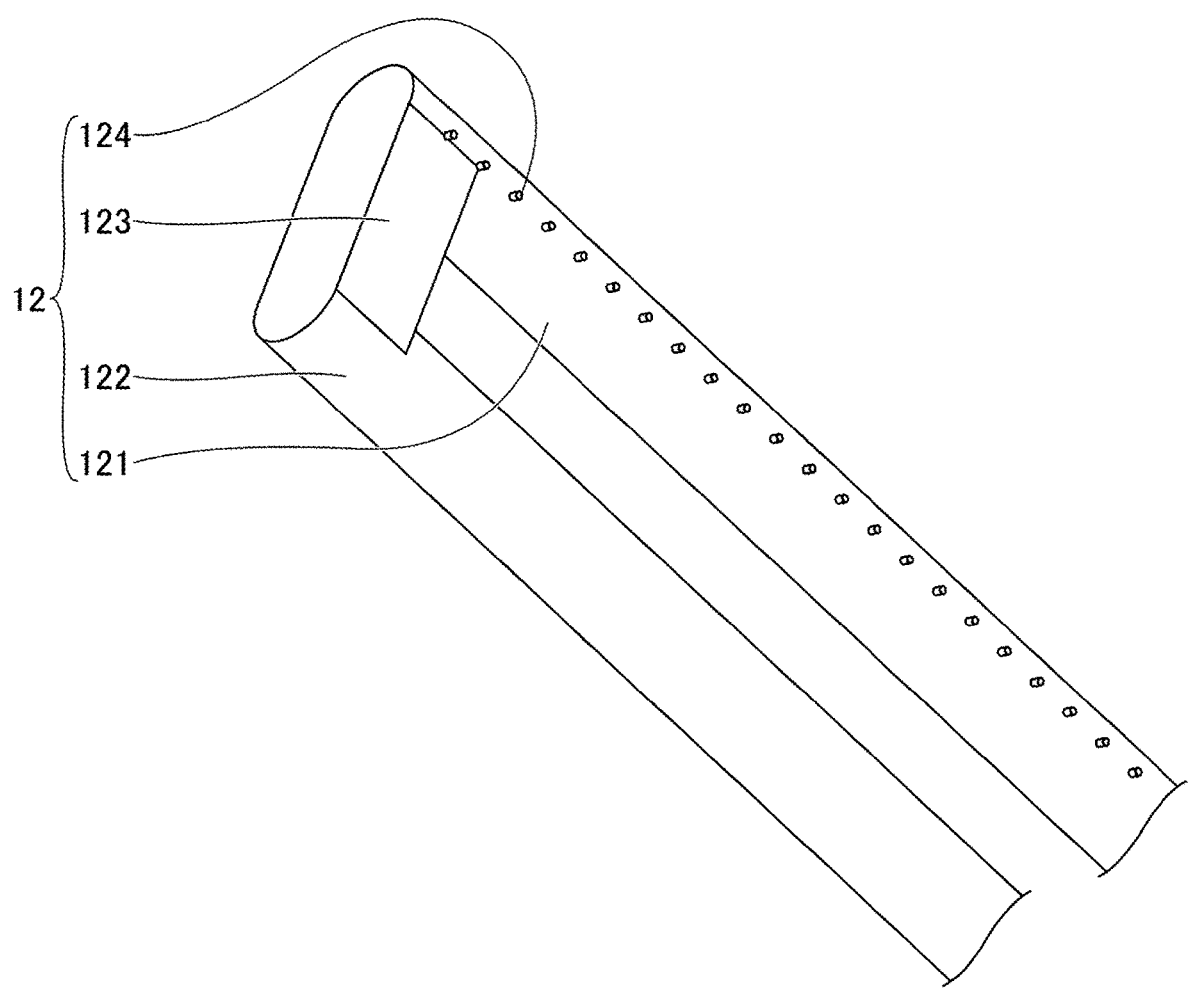
FIG. 2 is a perspective view illustrating an example of an injector of the substrate processing apparatus illustrated in FIG. 1.

A substrate processing apparatus according to a first embodiment will be described, by referring to FIG. 1 and FIG. 2. FIG. 1 is a diagram illustrating an example of a configuration of the substrate processing apparatus according to the first embodiment.

A substrate processing apparatus 1 includes a processing unit 10, a gas introducing unit 20, a gas exhaust unit 30, a heating unit 40, and a controller 90.

The processing unit 10 includes a processing chamber 11, injectors 12 and 13, an exhaust port 14, and s shutter 15.

The processing chamber 11 is elongated along a vertical direction, and accommodates a wafer board WB therein. The processing chamber 11 has a generally cylindrical shape with a ceiling and an open lower end. The processing chamber 11 may have a single-tube structure or a double-tube structure. The processing chamber 11 includes a reactive pipe formed of a heat resistant material, such as quartz or the like, and a manifold formed of stainless steel and disposed at a lower end of the reactive pipe.

The wafer board WB holds a plurality of semiconductor wafers (hereinafter referred to as "wafers W") at predetermined spacings in the vertical direction, in the form of a shelf. The wafer board WB is placed on a lid member CP, and is raised and lowered in the vertical direction together with the lid member CP, by a lift mechanism (not illustrated). When the wafer board WB is raised in an upward direction, the wafer board WB moves inside the processing chamber 11, and an opening at a lower end of the processing chamber 11 is closed and sealed by the lid member CP. On the other hand, when the wafer board WB is lowered in a downward direction, the wafer board WB moves outside the processing chamber 11, and releases the opening at the lower end of the processing chamber 11. In addition, the wafer board WB may be rotatable. FIG. 1 illustrates a state where the wafer board WB is moved outside the processing chamber 11.

The injector 12 disposed so as to penetrate the processing chamber 11. The injector 12 includes a source gas supply pipe 121, a diluent gas supply pipe 122, a connection pipe 123, and a plurality of gas discharge holes 124.

The source gas supply pipe 121 is disposed inside the processing chamber 11 along a longitudinal direction of the processing chamber 11, and a lower end of the source gas supply pipe 121 is bent in an L-shape and supported in a state penetrating the processing chamber 11. A connection port 121*a* of the source gas supply pipe 121, provided outside the processing chamber 11, is connected to a source gas introducing pipe 21*b* which will be described later. A source gas, a cleaning gas, and a purge gas are introduced into the source gas supply pipe 121 via the source gas introducing pipe 21*b*. The plurality of gas discharge holes 124 are formed in the source gas supply pipe 121 at predetermined intervals along the longitudinal direction of the source gas supply pipe 121. The gas discharge holes 124 discharge the source gas, the cleaning gas, and the purge gas in a horizontal direction. Hence, the source gas, the cleaning gas, and the purge gas are supplied approximately parallel to a principal surface of the wafer W. The predetermined intervals are set to be the same as the predetermined spacings with which the wafers W are supported on the wafer board WB, for example. In addition, the gas discharge holes 124 are disposed at positions, along a height direction of the source gas supply pipe 121, between two wafers W which are adjacent to each other along the vertical direction. For this reason, the source gas, the cleaning gas, and the purge gas can be supplied efficiently to a space between the two mutually adjacent wafers W.

The diluent gas supply pipe 122 is disposed inside the processing chamber 11 along the longitudinal direction of the processing chamber 11, and a lower end of the diluent gas supply pipe 122 is bent in an L-shape and supported in a state penetrating the processing chamber 11. A connection port 122*a* of the diluent gas supply pipe 122, provided outside the processing chamber 11, is connected to a diluent gas introducing pipe 23*b* which will be described later. A diluent gas is introduced into the diluent gas supply pipe 122 via the diluent gas introducing pipe 23*b*. The diluent gas supply pipe 122 supplies the diluent gas to the source gas supply pipe 121 via the connection pipe 123.

The connection pipe 123 is a tubular member which connects an upper portion of the source gas supply pipe 121 to an upper portion of the diluent gas supply pipe 122, thereby communicating the inside of the source gas supply pipe 121 with the inside of the diluent gas supply pipe 122. In this embodiment, the source gas supply pipe 121 and the diluent gas supply pipe 122 are connected by a single connection pipe 123, however, the source gas supply pipe 121 and the diluent gas supply pipe 122 may be connected by two or more connection pipes 123.

The injector 13 is disposed to penetrate the processing chamber 11. The injector 13 includes a reactive gas supply pipe 131, and a plurality of gas discharge holes 132.

The reactive gas supply pipe 131 is disposed inside the processing chamber 11 along the longitudinal direction of the processing chamber 11, and a lower end of the reactive gas supply pipe 131 is bent in an L-shape and supported in a state penetrating the processing chamber 11. A connection port 131*a* of the reactive gas supply pipe 131, provided outside the processing chamber 11, is connected to a reactive gas introducing pipe 24*b* which will be described later. A reactive gas and a purge gas are introduced into the reactive gas supply pipe 131 via the reactive gas introducing pipe 24*b*. The plurality of gas discharge holes 132 are formed in the reactive gas supply pipe 131 at predetermined intervals along the longitudinal direction of the reactive gas supply pipe 131. The gas discharge holes 132 discharge the reactive gas and purge gas in the horizontal direction. Hence, the reactive gas and the purge gas are supplied approximately parallel to the principal surface of the wafer W. The predetermined intervals are set to be the same as the predetermined spacings with which the wafers W are supported on the wafer board WB, for example. In addition, the gas discharge holes 132 are disposed at positions, along a height direction of the reactive gas supply pipe 131, between two wafers W which are adjacent to each other along the vertical direction. For this reason, the reactive gas and the purge gas can be supplied efficiently to the space between the two mutually adjacent wafers W.

The exhaust port 14 is disposed on a sidewall at lower portion of the processing chamber 11. The exhaust port 14 is configured to evacuate the gas inside the processing chamber 11.

The shutter 15 has a generally disk shape which is greater than the opening at the lower end of the processing chamber 11. The shutter 15 is movable in the horizontal direction between a position which closes and seals the opening at the lower end of the processing chamber 11, and a position which releases and opens the opening at the lower end of the processing chamber 11. The shutter 15 closes and seals the opening at the lower end of the processing chamber 11 if the wafer board WB is transported out of the processing chamber 11, for example. FIG. 1 illustrates the state where the shutter 15 is at the position to which releases and opens the opening at the lower end of the processing chamber 11.

The gas introducing unit 20 includes a source gas introducing unit 21, a cleaning gas introducing unit 22, a diluent gas introducing unit 23, a reactive gas introducing unit 24, a first vent unit 25, and a second vent unit 26. The gas introducing unit 20 may include a gas introducing unit which further introduces another gas.

The source gas introducing unit 21 introduces the source gas into the injector 12 via the connection port 121*a* at one end of the injector 12. The source gas introducing unit 21 includes a source gas source 21*a*, a source gas introducing pipe 21*b*, and a valve 21*c*.

The source gas source 21*a* supplies the source gas to the source gas introducing pipe 21*b*. The source gas source 21*a* may include a flow rate controller configured to control the flow rate of the source gas supplied to the source gas introducing pipe 21*b*, a storage (or buffer tank) configured to temporarily store and pressurize the source gas, or the like.

One end of the source gas introducing pipe 21*b* is connected to the source gas source 21*a*, and the other end of the source gas introducing pipe 21*b* is connected to the connection port 121*a* of the source gas supply pipe 121. The source gas introducing pipe 21*b* introduces the source gas supplied from the source gas source 21*a* into the source gas supply pipe 121. The source gas is a gas used for deposition by Atomic Layer Deposition (ALD) or Chemical Vapor Deposition (CVD), for example. Examples of the source gas include a silicon source gas, a metal source gas, or the like. The source gas is supplied, via the source gas supply pipe 121, into the processing chamber 11 which is heated to a temperature higher than or equal to a thermal decomposition temperature, for example.

The valve 21*c* is interposed in the source gas introducing pipe 21*b*, and is configured to open and close a passage of the fluid inside the source gas introducing pipe 21*b*. In this embodiment, a single valve 21*c* is interposed in the source gas introducing pipe 21*b*, however, two or more valves 21*c* may be interposed in the source gas introducing pipe 21*b*.

The cleaning gas introducing unit 22 introduces the cleaning gas into the injector 12 via a connection port 121a at one end of the injector 12. The cleaning gas introducing unit 22 includes a cleaning gas source 22a, a cleaning gas introducing pipe 22b, and a valve 22c.

The cleaning gas source 22a supplies the cleaning gas and the purge gas to the cleaning gas introducing pipe 22b. The cleaning gas source 22a may include a flow rate controller or the like configured to control a flow rate of the cleaning gas and the purge gas supplied to the cleaning gas introducing pipe 22b.

One end of the cleaning gas introducing pipe 22b is connected to the cleaning gas source 22a, and the other end of the cleaning gas introducing pipe 22b is connected to the source gas introducing pipe 21b. The cleaning gas introducing pipe 22b introduces the cleaning gas and the purge gas supplied from the cleaning gas source 22a into the source gas supply pipe 121 via the source gas introducing pipe 21b. The cleaning gas is a gas used to remove deposits deposited inside the processing chamber 11, inside the injector 12, or the like, and is selected according to the type of the source gas. Examples of the cleaning gas include gases including halogen, such as fluorine, chlorine, bromine, or the like. The purge gas is a gas used to replace the residual gas inside the processing chamber 11, inside the injector 12, or the like. Examples of the purge gas include inert gases, such as nitrogen ($N_2$) gas, argon (Ar) gas, or the like.

The valve 22c is interposed in the cleaning gas introducing pipe 22b, and is configured to open and close a passage of the fluid inside the cleaning gas introducing pipe 22b. In this embodiment, a single valve 22c is interposed in the cleaning gas introducing pipe 22b, however, two or more valves 22c may be interposed in the cleaning gas introducing pipe 22b.

The diluent gas introducing unit 23 introduces the diluent gas into the injector 12 via the connection port 122a at the other end of the injector 12. The diluent gas introducing unit 23 includes a diluent gas source 23a, a diluent gas introducing pipe 23b, and a valve 23c.

The diluent gas source 23a supplies the diluent gas to the diluent gas introducing pipe 23b. The diluent gas source 23a may include a flow rate controller or the like configured to control the flow rate of the diluent gas supplied to the diluent gas introducing pipe 23b.

One end of the diluent gas introducing pipe 23b is connected to the diluent gas source 23a, and the other end of the diluent gas introducing pipe 23b is connected to the connection port 122a of the diluent gas supply pipe 122. The diluent gas introducing pipe 23b introduces the diluent gas supplied from the diluent gas source 23a into the diluent gas supply pipe 122. The diluent gas is a gas used to dilute the source gas. Examples of the diluent gas include inert gases, such as $N_2$ gas, Ar gas, or the like, and hydrogen ($H_2$) gas, or the like.

The valve 23c is interposed in the diluent gas introducing pipe 23b, and is configured to open and close a passage of the fluid inside the diluent gas introducing pipe 23b. In this embodiment, a single valve 23c is interposed in the diluent gas introducing pipe 23b, however, two or more valves 23c may be interposed in the diluent gas introducing pipe 23b.

The reactive gas introducing unit 24 includes a reactive gas source 24a, a reactive gas introducing pipe 24b, and a valve 24c.

The reactive gas source 24a supplies the reactive gas and the purge gas to the reactive gas introducing pipe 24b. The reactive gas source 24a may include a flow controller or the like configured to control a flow rate of the reactive gas and purge gas supplied to the reactive gas introducing pipe 24b.

One end of the reactive gas introducing pipe 24b is connected to the reactive gas source 24a, and the other end of the reactive gas introducing pipe 24b is connected to the connection port 131a of the reactive gas supply pipe 131. The reactive gas introducing pipe 24b introduces the reactive gas and the purge gas supplied from the reactive gas source 24a into the injector 13. The reaction gas is a gas which reacts with the source gas to cause oxidizing, nitriding, or the like of the source material. Examples of the reactive gas include oxidizing gases, nitriding gases, or the like. Examples of purge gases include inert gases, such as $N_2$ gas, Ar gas, or the like.

The valve 24c is interposed in the reactive gas introducing pipe 24b, and is configured to open and close a passage of the fluid inside the reactive gas introducing pipe 24b. In this embodiment, a single valve 24c is interposed in the reactive gas introducing pipe 24b, however, two or more valves 24c may be interposed in the reactive gas introducing pipe 24b.

The first vent unit 25 includes a vent pipe 25b, and a valve 25c. The vent pipe 25b connects the source gas introducing pipe 21b to an exhaust pipe 31 which will be described later. The valve 25c is interposed in the vent pipe 25b, and is configured to control a communication state between the source gas introducing pipe 21b and the exhaust pipe 31. In other words, the source gas introducing pipe 21b and the exhaust pipe 31 communicate with each other in a state where the valve 25c is open, and the communication between the source gas introducing pipe 21b and the exhaust pipe 31 is blocked in a state where the valve 25c is closed. In this embodiment, a single valve 25c is interposed in the vent pipe 25b, however, two or more valves 25c may be interposed in the vent pipe 25b.

The second vent unit 26 includes a vent pipe 26b, and a valve 26c. The vent pipe 26b connects the diluent gas introducing pipe 23b to the exhaust pipe 31 which will be described later. The valve 26c is interposed in the vent pipe 26b, and is configured to control the communication between the diluent gas introducing pipe 23b and the exhaust pipe 31. In other words, the diluent gas introducing pipe 23b and the exhaust pipe 31 communicate with each other in a state where the valve 26c is open, and communication between the diluent gas introducing pipe 23b and the exhaust pipe 31 is blocked in a state where the valve 26c is closed. In this embodiment, a single valve 26c is interposed in the vent pipe 26b, however, two or more valves 26c may be interposed in the vent pipe 26b.

The gas exhaust unit 30 includes an exhaust pipe 31, a pressure control valve 32, and a vacuum pump 33. One end of the exhaust pipe 31 is connected to the exhaust port 14, and the other end of the exhaust pipe 31 is connected to the vacuum pump 33. A pressure control valve 32 is interposed in the exhaust pipe 31, and is configured to adjust the conductance of the exhaust pipe 31, thereby adjusting the pressure inside the processing chamber 11. The vacuum pump 33 evacuates the inside of the processing chamber 11 via the exhaust pipe 31. The vacuum pump 33 includes a mechanical booster pump, and a dry pump, for example.

The heating unit 40 has a generally cylindrical shape, and is disposed around processing chamber 11 so as to cover the processing chamber 11. The heating unit 40 includes a heating element, and an insulating element, and is configured to heat the wafers W accommodated inside the processing chamber 11 by the heat generated from the heating element.

The controller 90 controls the overall operation of the substrate processing apparatus 1. The controller 90 may be a computer, for example. The computer may include a processor, such as a Central Processing Unit (CPU), and a storage medium or device (both not illustrated). A computer program which, when executed by the computer (or processor), performs the overall operation of the substrate processing apparatus 1, may be stored in the storage medium or device. The storage medium or device may be any type of non-transitory computer-readable storage medium or device, including a flexible disk, a compact disk, a hard disk, a flash memory, a Digital Versatile Disk (DVD), or the like, for example.

<Operation of Substrate Processing Apparatus>

Figure 3:
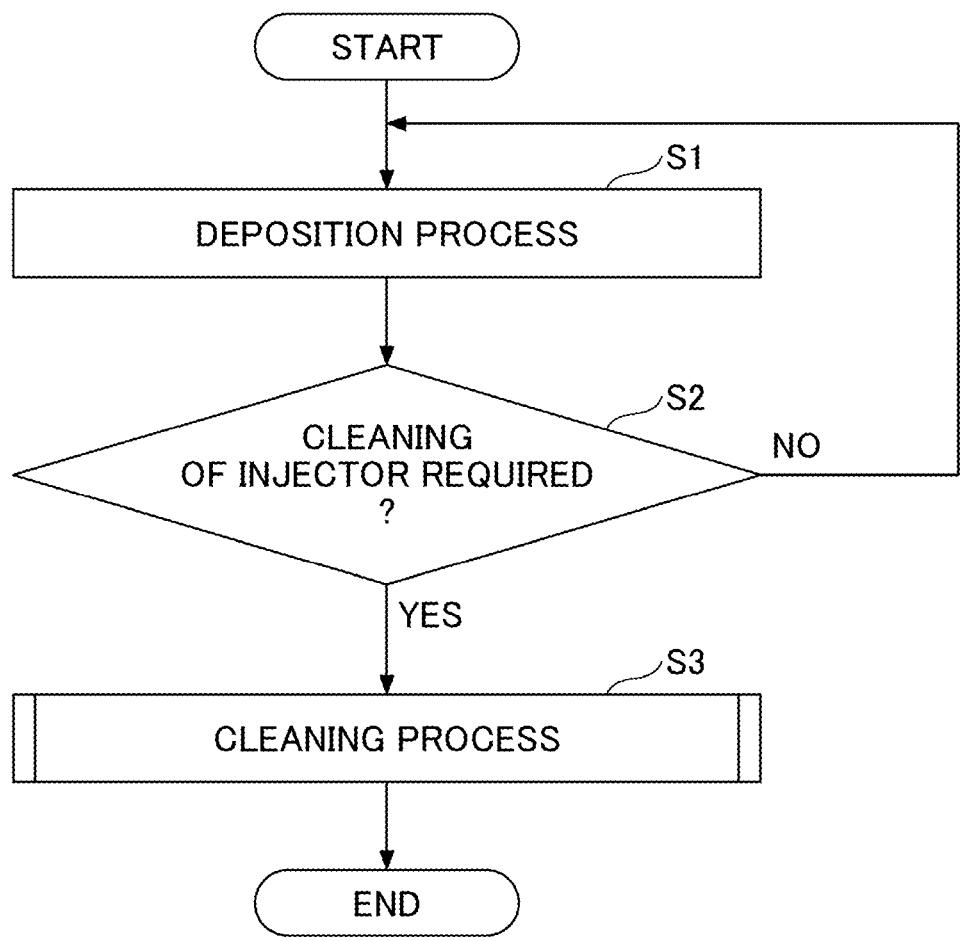
FIG. 3 is a flow chart illustrating an example of an operation of the substrate processing apparatus illustrated in FIG. 1.

An example of the operation of the substrate processing apparatus 1 will be described, by referring to FIG. 3. FIG. 3 is a flow chart illustrating the example of the operation of the substrate processing apparatus 1 illustrated in FIG. 1. In an initial state, it is assumed that the pressure control valve 32 and the valves 21c through 26c of the substrate processing apparatus 1 are closed.

First, in step S1, the controller 90 controls the operation of each part of the substrate processing apparatus 1, to perform a deposition process (or film forming process). In this embodiment, the controller 90 controls a lift mechanism to transport the wafer board WB which holds the plurality of wafers W into the processing chamber 11. Next, the controller 90 controls the pressure control valve 32 to adjust the inside of the processing chamber 11 to a predetermined pressure, and controls the heating unit 40 to heat the wafers W to a predetermined temperature. Then, the controller 90 controls the opening and closing of the valves 21c, 23c, and 24c to supply the source gas, the diluent gas, and the reactive gas into the processing chamber 11, to form a predetermined film on the wafers W. Next, the controller 90 returns the inside of the processing chamber 11 to the atmospheric pressure, and controls the lift mechanism to transport the wafer board WB outside the processing chamber 11.

Next, in step S2, the controller 90 determines whether or not a cleaning of the injector 12 is required. In this embodiment, the controller 90 determines that the cleaning of the injector 12 is required when an execution time of the deposition process exceeds a predetermined time. On the other hand, the controller 90 determines that the cleaning of the injector 12 is not required when the execution time of the deposition process does not exceed the predetermined time. When the controller 90 determines that the cleaning of the injector 12 is not required, and the decision result in step S2 is NO, the controller 90 returns the process to step S1. In other words, the controller 90 continues the deposition process without performing the cleaning process with respect to the injector 12. On the other hand, when the controller 90 determines that the cleaning of the injector 12 is required, and the decision result in step S2 is YES, the controller 90 performs the cleaning process with respect to the injector 12 in step S3, and ends the process.

Figure 4:
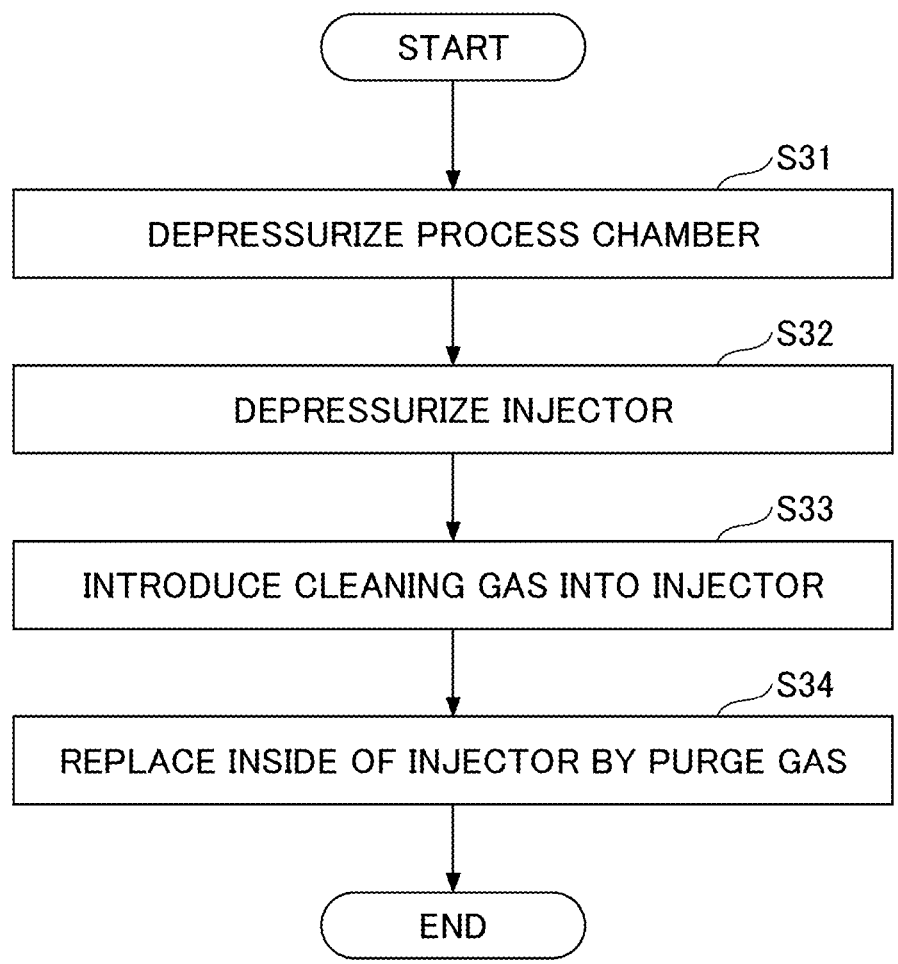
FIG. 4 is a flow chart illustrating an example of a cleaning process with respect to the injector.

An example of the cleaning process (or cleaning method) with respect to the injector 12 will be described by referring to FIG. 4. FIG. 4 is a flow chart illustrating an example of the cleaning process with respect to the injector 12.

First, the controller 90 depressurizes the inside of the processing chamber 11 in step S31. In this embodiment, the controller 90 controls the shutter 15 to close and seal the opening at the lower end of the processing chamber 11 by the shutter 15. Next, the controller 90 opens the pressure control valve 32, to cause the inside of the processing chamber 11 to communicate with the vacuum pump 33 via the exhaust pipe 31, and evacuates and depressurizes the inside of the processing chamber 11. After the inside of the processing chamber 11 reaches a predetermined degree of vacuum, the controller 90 closes the pressure control valve 32.

Next, in step S32, the controller 90 depressurizes the inside of the injector 12. In this embodiment, the controller 90 opens the valve 26c, and communicates the inside of the diluent gas supply pipe 122 of the injector 12 with the vacuum pump 33 via the vent pipe 26b, thereby evacuating and depressurizing the inside of the diluent gas supply pipe 122.

Then, in step S33, the controller 90 introduces the cleaning gas into the injector 12. In this embodiment, the controller 90 opens the valve 22c, and introduces the cleaning gas from the cleaning gas source 22a into the source gas supply pipe 121. In this state, the inside of the diluent gas supply pipe 122 is depressurized. For this reason, a percentage of the cleaning gas discharged into the processing chamber 11 via the gas discharge holes 124 is low, while a percentage of the cleaning gas discharged by the vacuum pump 33 by passing through the diluent gas supply pipe 122 and the vent pipe 26b is high. In other words, the cleaning gas introduced into the source gas supply pipe 121 selectively passes through the diluent gas supply pipe 122 and the vent pipe 26b. As a result, it is possible to selectively clean the inside of the injector 12. In step S33, the controller 90 preferably opens the valve 24c to supply the purge gas from the injector 13 into the processing chamber 11. In this case, even if the cleaning gas is discharged into the processing chamber 11 through the gas discharge holes 124 of the injector 12, it is possible to reduce the cleaning of the inside of the processing chamber 11 by the cleaning gas because the inside of the processing chamber 11 is filled with the purge gas. After a predetermined time elapses, the controller 90 closes the valve 22c, and stops introducing the cleaning gas into the source gas supply pipe 121. The predetermined time may be a time required to remove all of the deposits inside the source gas supply pipe 121 and inside the diluent gas supply pipe 122, for example.

Next, in step S34, the controller 90 replaces the inside of the injector 12 with the purge gas. In this embodiment, the controller 90 introduces the purge gas into the source gas supply pipe 121 by opening the valve 22c. In this state, the inside of the diluent gas supply pipe 122 is depressurized. For this reason, a percentage of the purge gas discharged into the processing chamber 11 via the gas discharge holes 124 is low, while a percentage of the purge gas discharged by the vacuum pump 33 by passing through the diluent gas supply pipe 122 and the vent pipe 26b is high. In other words, the purge gas introduced into the source gas supply pipe 121 selectively passes through the diluent gas supply pipe 122 and the vent pipe 26b. As a result, the cleaning residue inside the source gas supply pipe 121 and inside the diluent gas supply pipe 122 can be efficiently discharged by the vacuum pump 33. After a predetermined time elapses, the controller 90 closes the valve 22c, and stops introducing the purge gas into the source gas supply pipe 121. Further, the controller 90 closes the valve 26c, and ends the process.

As described above, according to the substrate processing apparatus 1 according to the first embodiment, the source gas introducing pipe 21b and the cleaning gas introducing pipe 22b are connected to one end of the injector 12, and the vent pipe 26b is connected to the other end of the injector 12. Hence, it is possible to introduce the source gas and the cleaning gas from the connection port 121a at one end of the injector 12, and exhaust the gas inside the injector 12 from the connection port 122a at the other end of the injector 12. For this reason, the inside of the injector 12 can be selectively cleaned with respect to the inside of the processing chamber 11.

In addition, the substrate processing apparatus 1 according to the first embodiment includes the shutter 15 configured to close and seal the opening at the lower end of the processing chamber 11 if the wafer board WB is transported out of the processing chamber 11. For this reason, it is possible to clean the inside of the injector 12 while the wafer board WB, holding the wafers W and transported out of the processing chamber 11 after performing the deposition process, is cooled (or subject to a cooling process). Accordingly, it is possible to efficiently utilize a wafer cooling time, thereby improving the productivity of the substrate processing apparatus 1.

Second Embodiment

<Substrate Processing Apparatus>

Figure 5:
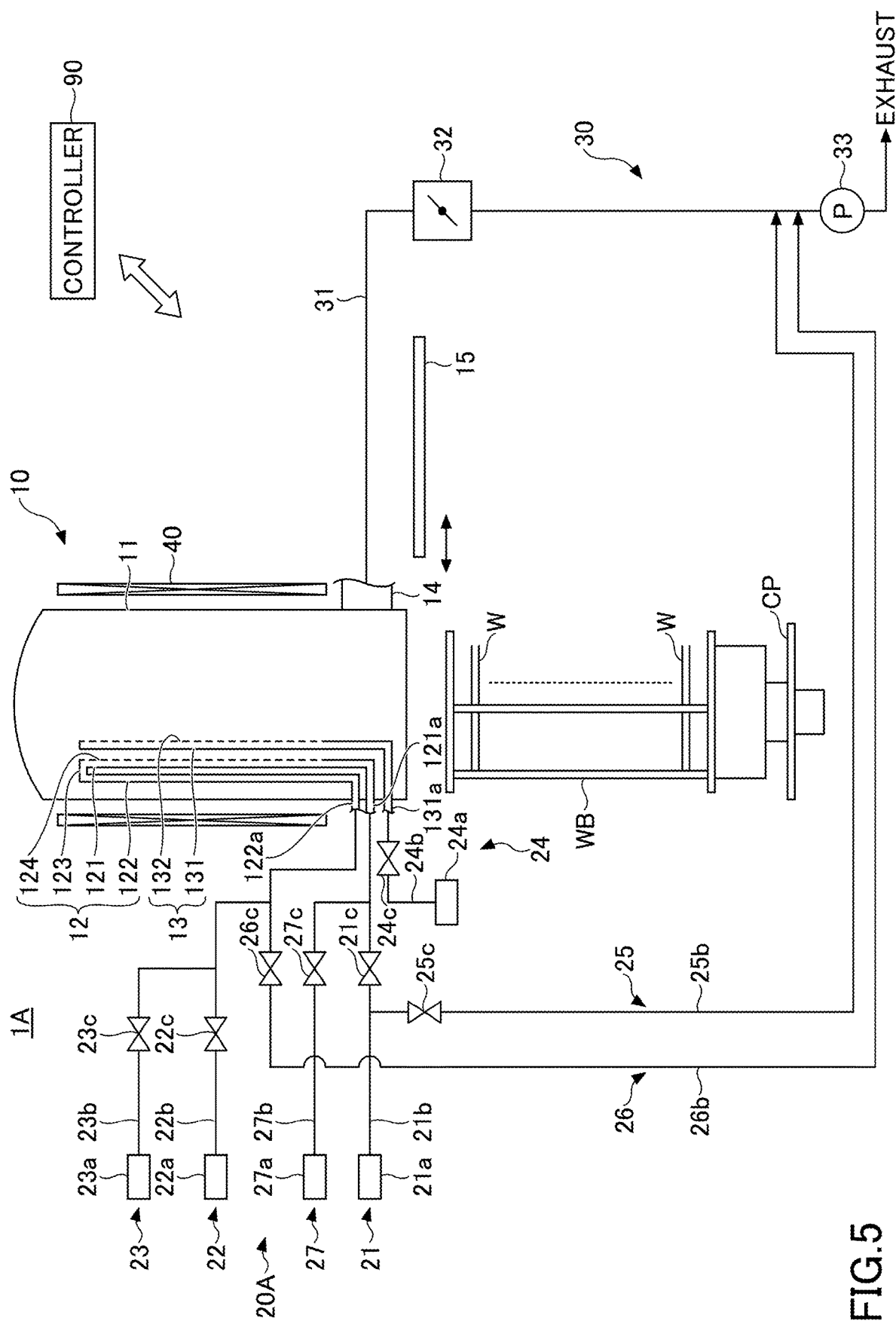
FIG. 5 is a diagram schematically illustrating an example of the substrate processing apparatus according to a second embodiment.

The substrate processing apparatus according to a second embodiment will be described, by referring to FIG. 5. FIG. 5 is a diagram illustrating an example of the configuration of the substrate processing apparatus according to the second embodiment.

A substrate processing apparatus 1A according to the second embodiment differs from the substrate processing apparatus 1 according to the first embodiment, in that the cleaning gas introducing unit 22 is configured to introduce the cleaning gas into the injector 12 via the connection port 122a at the other end of the injector 12. Hereinafter, a description will mainly be given with respect to elements which differs from the substrate processing apparatus 1 according to the first embodiment.

The substrate processing apparatus 1A includes the processing unit 10, a gas introducing unit 20A, the gas exhaust unit 30, the heating unit 40, and the controller 90.

The gas introducing unit 20A includes the source gas introducing unit 21, the cleaning gas introducing unit 22, the diluent gas introducing unit 23, the reactive gas introducing unit 24, the first vent unit 25, the second vent unit 26, and a purge gas introducing unit 27. The gas introducing unit 20A may include a gas introducing unit which further introduces another gas.

The cleaning gas introducing unit 22 introduces the cleaning gas into the injector 12 via the connection port 122a at the other end of the injector 12. The cleaning gas introducing unit 22 includes the cleaning gas source 22a, the cleaning gas introducing pipe 22b, and the valve 22c.

The cleaning gas source 22a supplies the cleaning gas and the purge gas to the cleaning gas introducing pipe 22b. The cleaning gas source 22a may include a flow rate controller or the like configured to control a flow rate of the cleaning gas and the purge gas supplied to the cleaning gas introducing pipe 22b.

One end of the cleaning gas introducing pipe 22b is connected to the cleaning gas source 22a, and the other end of the cleaning gas introducing pipe 22b is connected to the connection port 122a of the diluent gas supply pipe 122. The cleaning gas introducing pipe 22b introduces the cleaning gas and the purge gas supplied from the cleaning gas source 22a into the diluent gas supply pipe 122.

The valve 22c is interposed in the cleaning gas introducing pipe 22b, and is configured to open and close the passage of fluid inside the cleaning gas introducing pipe 22b. In this embodiment, a single valve 22c is interposed in the cleaning gas introducing pipe 22b, however, two or more valves 22c may be interposed in the cleaning gas introducing pipe 22b.

The diluent gas introducing unit 23 introduces the diluent gas into the injector 12 via the connection port 122a at the other end of the injector 12. The diluent gas introducing unit 23 includes the diluent gas source 23a, the diluent gas introducing pipe 23b, and the valve 23c.

The diluent gas source 23a supplies the diluent gas to the diluent gas introducing pipe 23b. The diluent gas source 23a may include a flow rate controller or the like configured to control a flow rate of the diluent gas supplied to the diluent gas introducing pipe 23b.

One end of the diluent gas introducing pipe 23b is connected to the diluent gas source 23a, and the other end of the diluent gas introducing pipe 23b is connected to the cleaning gas introducing pipe 22b. The diluent gas introducing pipe 23b introduces the diluent gas supplied from the diluent gas source 23a into the diluent gas supply pipe 122 via the cleaning gas introducing pipe 22b.

The valve 23c is interposed in the diluent gas introducing pipe 23b, and is configured to open and close a passage of the fluid inside the diluent gas introducing pipe 23b. In this embodiment, a single valve 23c is interposed in the diluent gas introducing pipe 23b, however, two or more valves 23c may be interposed in the diluent gas introducing pipe 23b.

The purge gas introducing unit 27 introduces the purge gas into the injector 12 via the connection port 121a at one end of the injector 12. The purge gas introducing unit 27 includes a purge gas source 27a, a purge gas introducing pipe 27b, and a valve 27c.

The purge gas source 27a supplies the purge gas to the purge gas introducing pipe 27b. The purge gas source 27a may include a flow rate controller or the like configured to control a flow rate of the purge gas supplied to the purge gas introducing pipe 27b.

One end of the purge gas introducing pipe 27b is connected to the purge gas source 27a, and the other end of the purge gas introducing pipe 27b is connected to the source gas introducing pipe 21b. The purge gas introducing pipe 27b introduces the purge gas supplied from the purge gas source 27a into the source gas supply pipe 121 via the source gas introducing pipe 21b. The purge gas is a gas used to replace the residual gas inside the processing chamber 11, the injector 12, or the like. Examples of the purge gas include inert gases, such as $N_2$ gas, Ar gas, or the like.

The valve 27c is interposed in the purge gas introducing pipe 27b, and is configured to open and close a passage of the fluid inside the purge gas introducing pipe 27b. In this embodiment, a single valve 27c is interposed in the purge gas introducing pipe 27b, however, two or more valves 27c may be interposed in the purge gas introducing pipe 27b.

<Operation of Substrate Processing Apparatus>

An example of the operation of the substrate processing apparatus 1A will be described, by referring to FIG. 3. In the initial state, it is assumed that the pressure control valve 32, and the valves 21c through 27c of the substrate processing apparatus 1A are closed.

First, in step S1, the controller 90 controls the operation of each part of the substrate processing apparatus 1A, to perform the deposition process (or film forming process). In this embodiment, the controller 90 controls the lift mechanism to transport the wafer board WB which holds the plurality of wafers W into the processing chamber 11. Next, the controller 90 controls the pressure control valve 32 to adjust the inside of the processing chamber 11 to a predetermined pressure, and controls the heating unit 40 to heat the wafers W to the predetermined temperature. Then, the controller 90 controls the opening and closing of the valves 21c, 23c, 24c, and 27c to supply the source gas, the diluent gas, the reactive gas, and the purge gas into the processing chamber 11, to form the predetermined film on the wafers W. Next, the controller 90 returns the inside of the processing chamber 11 to the atmospheric pressure, and controls the lift mechanism to transport the wafer board WB outside the processing chamber 11.

Next, in step S2, the controller 90 determines whether or not the cleaning of the injector 12 is required. In this embodiment, the controller 90 determines that the cleaning of the injector 12 is required when the execution time of the deposition process exceeds the predetermined time. On the other hand, the controller 90 determines that the cleaning of the injector 12 is not required when the execution time of the deposition process does not exceed the predetermined time. When the controller 90 determines that the cleaning of the injector 12 is not required, and the decision result in step S2 is NO, the controller 90 returns the process to step S1. In other words, the controller 90 continues the deposition process without performing the cleaning process with respect to the injector 12. On the other hand, when the controller 90 determines that the cleaning of the injector 12 is required, and the decision result in step S2 is YES, the controller 90 performs the cleaning process with respect to the injector 12 in step S3, and ends the process.

An example of the cleaning process (or cleaning method) with respect to the injector 12 will be described by referring to FIG. 4.

First, the controller 90 depressurizes the inside of the processing chamber 11 in step S31. In this embodiment, the controller 90 controls the shutter 15 to close and seal the opening at the lower end of the processing chamber 11 by the shutter 15. Next, the controller 90 opens the pressure control valve 32, to cause the inside of the processing chamber 11 to communicate with the vacuum pump 33 via the exhaust pipe 31, and evacuates and depressurizes the inside of the processing chamber 11. After the inside of the processing chamber 11 reaches the predetermined degree of vacuum, the controller 90 closes the pressure control valve 32.

Next, in step S32, the controller 90 depressurizes the inside of the injector 12. In this embodiment, the controller 90 opens the valve 25c, and communicates the inside of the source gas supply pipe 121 of the injector 12 with the vacuum pump 33 via the vent pipe 25b, thereby evacuating and depressurizing the inside of the source gas supply pipe 121.

Then, in step S33, the controller 90 introduces the cleaning gas into the injector 12. In this embodiment, the controller 90 opens the valve 22c, and introduces the cleaning gas from the cleaning gas source 22a into the diluent gas supply pipe 122. In this state, the inside of the source gas supply pipe 121 is depressurized. For this reason, the percentage of the cleaning gas discharged into the processing chamber 11 via the gas discharge holes 124 is low, while the percentage of the cleaning gas discharged by the vacuum pump 33 by passing through the source gas supply pipe 121 and the vent pipe 25b is high. In other words, the cleaning gas introduced into the diluent gas supply pipe 122 selectively passes through the source gas supply pipe 121 and the vent pipe 25b. As a result, it is possible to selectively clean the inside of the injector 12. In step S33, the controller 90 preferably opens the valve 24c to supply the purge gas from the injector 13 into the processing chamber 11. In this case, even if the cleaning gas is discharged into the processing chamber 11 through the gas discharge holes 124 of the injector 12, it is possible to reduce the cleaning of the inside of the processing chamber 11 by the cleaning gas because the inside of the processing chamber 11 is filled with the purge gas. After a predetermined time elapses, the controller 90 closes the valve 22c, and stops introducing the cleaning gas into the diluent gas supply pipe 122. The predetermined time may be a time required to remove all of the deposits inside the source gas supply pipe 121 and inside the diluent gas supply pipe 122, for example.

Next, in step S34, the controller 90 replaces the inside of the injector 12 with the purge gas. In this embodiment, the controller 90 introduces the purge gas into the diluent gas supply pipe 122 by opening the valve 22c. In this state, the inside of the source gas supply pipe 121 is depressurized. For this reason, the percentage of the purge gas discharged into the processing chamber 11 via the gas discharge holes 124 is low, while the percentage of the purge gas discharged by the vacuum pump 33 by passing through the source gas supply pipe 121 and the vent pipe 25b is high. In other words, the purge gas introduced into the diluent gas supply pipe 122 selectively passes through the source gas supply pipe 121 and the vent pipe 25b. As a result, the cleaning residue inside the source gas supply pipe 121 and inside the diluent gas supply pipe 122 can be efficiently discharged by the vacuum pump 33. After a predetermined time elapses, the controller 90 closes the valve 22c, and stops introducing the purge gas into the source gas supply pipe 121. Further, the controller 90 closes the valve 25c, and ends the process.

As described above, according to the substrate processing apparatus 1A according to the second embodiment, the source gas introducing pipe 21b and the vent pipe 25b are connected to one end of the injector 12, and the cleaning gas introducing pipe 22b is connected to the other end of the injector 12. Hence, it is possible to introduce the cleaning gas from the connection port 122a at the other end of the injector 12, and exhaust the gas inside the injector 12 from the connection port 121a at one end of the injector 12. For this reason, the inside of the injector 12 can be selectively cleaned with respect to the inside of the processing chamber 11.

In addition, the substrate processing apparatus 1A according to the second embodiment includes the shutter 15 configured to close and seal the opening at the lower end of the processing chamber 11 if the wafer board WB is transported out of the processing chamber 11. For this reason, it is possible to clean the inside of the injector 12 while the wafer board WB, holding the wafers W and transported out of the processing chamber 11 after performing the deposition process, is cooled (or subject to the cooling process). Accordingly, it is possible to efficiently utilize the wafer cooling time, thereby improving the productivity of the substrate processing apparatus 1.

In the embodiments described above, the connection port 121a is an example of a first connection port, and the connection port 122a is an example of a second connection port. In addition, the source gas supply pipe 121 is an example of a first gas pipe, and the diluent gas supply pipe 122 is an example of a second gas pipe. Moreover, the valve 22c is an example of a first valve, the valves 25c and 26c are examples of a second valve, and the pressure control valve 32 is an example of a third valve. Furthermore, the wafer W is an example of a substrate.

According to each of the embodiments and modifications, it is possible to selectively clean the inside of the injector.

While certain embodiments have been described, these embodiments have been presented by way of example only, and are not intended to limit the scope of the disclosures.

Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
   a processing chamber configured to accommodate a substrate;
   an injector, including a first connection port and a second connection port, wherein an inside of the injector communicates with an inside of the processing chamber;
   an exhaust pipe configured to exhaust the inside of the processing chamber;
   a source gas introducing pipe configured to introduce a source gas into the injector;
   a cleaning gas introducing pipe configured to introduce a cleaning gas into the injector; and
   a vent pipe configured to exhaust the inside of the injector,
   wherein each of the source gas introducing pipe and the vent pipe communicates with the first connection port without communicating through the second connection port, and the cleaning gas introducing pipe communicates with the second connection port without communicating through the first connection port.

2. The substrate processing apparatus as claimed in claim 1, wherein the injector includes a plurality of gas discharge holes which communicate with the inside of the processing chamber.

3. The substrate processing apparatus as claimed in claim 1, wherein the cleaning gas introducing pipe is configured to introduce a diluent gas.

4. The substrate processing apparatus as claimed in claim 1, wherein
   the processing chamber has an elongated shape which is generally cylindrical, and
   the injector includes
      a first gas pipe disposed inside the processing chamber along a longitudinal direction of the processing chamber, and including the first connection port, and a plurality of gas discharge holes disposed along the longitudinal direction of the processing chamber,
      a second gas pipe disposed inside the processing chamber along the longitudinal direction of the processing chamber, and including the second connection port, and
      a connection pipe configured to communicate an inside of the first gas pipe with an inside of the second gas pipe.

5. The substrate processing apparatus as claimed in claim 4, further comprising:
   a first valve disposed in the cleaning gas introducing pipe;
   a second valve disposed in the vent pipe; and
   a controller configured to control the opening and closing of the first valve and the second valve,
   wherein the controller is configured to control the first valve and the second valve to open the first valve after opening the second valve when introducing the cleaning gas into the injector.

6. The substrate processing apparatus as claimed in claim 5, further comprising:
   a third valve disposed in the exhaust pipe,
   wherein the controller is configured to control the first valve, the second valve, and the third valve to open the first valve and the second valve in a state where the third valve is closed.

* * * * *